United States Patent
Tao et al.

(10) Patent No.: US 12,261,229 B1
(45) Date of Patent: Mar. 25, 2025

(54) SOLAR CELL AND PHOTOVOLTAIC MODULE

(71) Applicant: JINKO SOLAR (HAINING) CO., LTD., Haining (CN)

(72) Inventors: Wusong Tao, Haining (CN); Niannian Qin, Haining (CN); Luchuang Wang, Haining (CN)

(73) Assignee: JINKO SOLAR (HAINING) CO., LTD., Haining (CN)

( * ) Notice: Subject to any disclaimer, the term of this patent is extended or adjusted under 35 U.S.C. 154(b) by 0 days.

(21) Appl. No.: 18/396,956

(22) Filed: Dec. 27, 2023

(30) Foreign Application Priority Data

Nov. 7, 2023 (CN) .......................... 202311468056.5

(51) Int. Cl.
*H01L 31/02* (2006.01)
*H01L 31/048* (2014.01)
*H01L 31/049* (2014.01)
*H01L 31/05* (2014.01)

(52) U.S. Cl.
CPC ...... *H01L 31/0201* (2013.01); *H01L 31/0488* (2013.01); *H01L 31/049* (2014.12); *H01L 31/0516* (2013.01)

(58) Field of Classification Search
CPC ............. H01L 31/0201; H01L 31/0488; H01L 31/049; H01L 31/0516
See application file for complete search history.

(56) References Cited

U.S. PATENT DOCUMENTS

| | | | |
|---|---|---|---|
| 2002/0059952 A1 | 5/2002 | Shimada | |
| 2015/0280641 A1* | 10/2015 | Garg | H01L 31/0475 136/244 |
| 2018/0204968 A1 | 7/2018 | Zhang | |
| 2018/0294375 A1 | 10/2018 | Spotti | |
| 2019/0074395 A1* | 3/2019 | Jang | H01L 31/0512 |

FOREIGN PATENT DOCUMENTS

| | | |
|---|---|---|
| CN | 209216999 U | 8/2019 |
| CN | 210040210 U | 2/2020 |
| CN | 210224044 U | 3/2020 |

(Continued)

OTHER PUBLICATIONS

Japan Office Action issued in corresponding JP Application 2023-220738, issued Mar. 26, 2024, and an English Translation, 12 pages.

(Continued)

*Primary Examiner* — Michael Y Sun
(74) *Attorney, Agent, or Firm* — Burris Law, PLLC

(57) ABSTRACT

Provided are a solar cell, a method for manufacturing a solar cell, and a photovoltaic module. A plurality of first pad groups and at least one second pad group are arranged along a first direction on a back surface of the solar cell. The second pad group is distributed in a region of the solar cell adjacent to a cut edge or a non-cut edge of the solar cell. The first pad groups are distributed in a region of the solar cell away from the cut edge or the non-cut edge. Along the first direction, a distance between a pad in the second pad group and a pad in the first pad group adjacent to the pad in the second pad group is greater than a distance between adjacent pads in adjacent first pad groups.

8 Claims, 4 Drawing Sheets

(56) References Cited

FOREIGN PATENT DOCUMENTS

| | | |
|---|---|---|
| CN | 211428184 U | 9/2020 |
| CN | 114628542 A | 6/2022 |
| CN | 115101617 A | 9/2022 |
| CN | 217719627 U | 11/2022 |
| CN | 115588706 | 1/2023 |
| CN | 116031321 A | 4/2023 |
| JP | 2014127552 | 7/2014 |
| JP | 2018056563 | 4/2018 |
| WO | 2012090694 | 7/2012 |
| WO | 2023001509 A1 | 1/2023 |

OTHER PUBLICATIONS

Office Action issued in corresponding CN Application 2023114680565, issued Dec. 21, 2023, and an English Translation, 12 pages.
Extended European Search Report issued in corresponding EP Application 23220278.8, issued Jul. 1, 2024, 8 pages.

\* cited by examiner

SOLAR CELL AND PHOTOVOLTAIC MODULE

CROSS-REFERENCE TO RELATED APPLICATION

This application claims priority to and the benefit of Chinese Patent Application No. 202311468056.5, filed on Nov. 7, 2023. The disclosure of the above application is incorporated herein by reference in its entirety.

FIELD

The present disclosure relates to the technical field of photovoltaic, and in particular, to a solar cell and a photovoltaic module.

BACKGROUND

The statements in this section merely provide background information related to the present disclosure and may not constitute prior art.

A back-contact solar cell means that positive and negative metal electrodes (including positive and negative busbars and positive and negative fingers) and PN junctions of the solar cell are located on a back surface of the solar cell, and the positive and negative metal electrodes are distributed at intervals. The back-contact solar cell having this structure can reduce optical losses and have a higher short-circuit current Jsc because a front surface (light conversion surface) of the solar cell is not blocked by structures such as positive and negative metal electrodes. At the same time, on the back surface of the solar cell, wider positive and negative metal electrodes can reduce series resistance Rs of the solar cell, thereby increasing a fill factor (FF). Moreover, in combination with an open-circuit voltage gain caused by a front surface field of the solar cell and good passivation, output power of the back-contact solar cell is increased, and conversion efficiency of the back-contact solar cell is high. Therefore, the back-contact solar cell has good commercial prospects.

An existing back-contact solar cell includes a plurality of solar cells. The solar cells are connected by conductive wires to form a solar cell string to obtain a high-efficiency output module. However, since pads are arranged on the back surface of the solar cell and adjacent pads on adjacent solar cells are at a relatively large distance, the conductive wire connecting the pads is prone to deviation or distortion during soldering and lamination.

SUMMARY

This section provides a general summary of the disclosure and is not a comprehensive disclosure of its full scope or all of its features.

The present disclosure provides a solar cell, a manufacturing method thereof, and a photovoltaic module. At least one pad in a second pad group in a region of the solar cell adjacent to a cut edge or a non-cut edge is moved closer to the cut edge or the non-cut edge.

In one aspect of the present disclosure, a solar cell is provided. The solar cell includes a plurality of first pad groups and a second pad group.

The plurality of first pad groups and the second pad group are distributed along a first direction on a back surface of the solar cell, the second pad group is distributed in a region adjacent to a cut edge or a non-cut edge of the solar cell, and the plurality of first pad groups are distributed in a region away from the cut edge or the non-cut edge of the solar cell.

Along the first direction, a distance between a pad in the second pad group and a pad in the plurality of first pad groups adjacent to the pad in the second pad group is greater than a distance between adjacent pads in adjacent first pad groups of the plurality of first pad groups.

According to this aspect of the present disclosure, at least one pad in the second pad group in the region of the solar cell adjacent to the cut edge or the non-cut edge is moved outwards, which can shorten a distance between adjacent pads on adjacent solar cells. When adjacent pads of adjacent solar cells are connected through a conductive wire, deviation and distortion of the conductive wires during soldering and lamination can be prevented, and the photovoltaic module has a high manufacturing yield.

In another aspect of the present disclosure, a method for manufacturing a solar cell is provided.

The method includes: arranging a plurality of pads on busbars on a back surface of a solar cell to form a plurality of first pad groups and at least one second pad group arranged along a first direction. The second pad group is distributed in a region of the solar cell adjacent to a cut edge or a non-cut edge of the solar cell, and the first pad groups are distributed in a region of the solar cell away from the cut edge or the non-cut edge. Along the first direction, a distance between a pad in the second pad group and a pad in the plurality of first pad groups adjacent to the pad in the second pad group is greater than a distance between adjacent pads in adjacent first pad groups of the plurality of first pad groups.

In yet aspect of the present disclosure, a solar cell is provided. The solar cell includes: a substrate, a finger on a back surface of the substrate and extending along a first direction, and a busbar on the back surface of the substrate and extending along a second direction. The substrate includes a cut edge and a non-cut edge opposite to the cut edge. The busbar is connected to the finger and provided with a plurality of pads, and the plurality of pads include a first pad adjacent to the cut edge, a second pad adjacent to the non-cut edge, and intermediate pads located between the first pad and the second pads. A distance between the first pad and one of the intermediate pads adjacent to the first pad is greater than a distance between two adjacent intermediate pads.

In still another aspect of the present disclosure, a photovoltaic module is provided. The photovoltaic module includes a front substrate, a first sealing member, a solar cell string, a second sealing member, and a back substrate. The solar cell string includes a plurality of solar cells in the first aspect or a plurality of solar cells manufactured by method in the second aspect.

Adjacent solar cells of the plurality of solar cells in the solar cell string are connected through a conductive wire, the conductive wire is soldered with the pads of the adjacent solar cells, and a distance between the second pad groups at adjacent edges of the adjacent solar cells ranges from 9 mm to 25 mm.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which.

Figure 1:
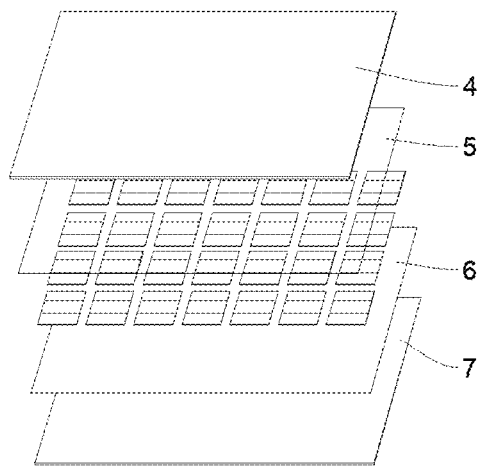
FIG. 1 is a schematic structural diagram of a photovoltaic module according to the present disclosure.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

In order to better understand the technical solution of the present disclosure, some embodiments of the present disclosure will be described in detail below with reference to the accompanying drawings.

It should be clear that the described embodiments are only some of rather than all of the embodiments of the present disclosure. Based on the embodiments in the present disclosure, all other embodiments obtained by those of ordinary skill in the art without creative efforts fall within the protection scope of the present disclosure.

The terms used in the embodiments of the present disclosure are for the purpose of describing specific embodiments only and are not intended to limit the present disclosure. The singular forms of "a/an", "said", and "the" used in the embodiments of the present disclosure and the appended claims may also include plural forms, unless otherwise clearly specified by the context.

It should be understood that the term "and/or" used herein merely describes an association relationship between associated objects and represents that three relationships may exist. For example, A and/or B may represent the following three cases: only A exists, both A and B exist, and only B exists. In addition, the character "/" generally indicates an "or" relationship between the associated objects.

It is to be noted that the direction words "up", "down", "left", and "right" described in the embodiments of the present disclosure are all based on the directions shown in the drawings, and should not be understood as limiting the embodiments of the present disclosure. In addition, in the context, it is to be further understood that, when it is mentioned that an element is formed "up" or "down" on another element, the element not only be directly formed "up" or "down" on another element, but also indirectly formed "up" or "down" on another element through an intermediate element.

In some embodiments, referring to FIG. 1, a photovoltaic module includes a laminated assembly and a frame. The laminated assembly includes a front substrate 4, a first sealing member 5, a plurality of solar cell strings, a second sealing member 6, and a back substrate 7.

The front substrate 4 is disposed on the first sealing member 5 and configures the front surface of the photovoltaic module. The back substrate 7 is disposed on the second sealing member 6 and configures the back surface of the photovoltaic module. Each of the front substrate 4 and the back substrate 7 may be formed of an insulation material capable of protecting the solar cell strings from external shocks, moisture, ultraviolet light, and the like. In addition, the front substrate 4 may be formed of a light-transmitting material capable of transmitting light, and the back substrate 7 may be configured as a sheet formed of a light-transmitting material, a material that does not transmit light, or a material that reflects light. For example, the front substrate 4 may be a photovoltaic glass, and the back substrate 7 may be a photovoltaic back sheet.

The first sealing member 5 and the second sealing member 6 prevent the introduction of moisture and oxygen, and realize a chemical bond between the front substrate 4 and the solar cell strings and between the back substrate 7 and the solar cell strings. The first and second sealing members 5 and 6 may be formed of an insulation material having light transmittances and adhesive properties. The back substrate 7, the second sealing member 6, the solar cell strings, the first sealing member 5, and the front substrate 4 may be integrated with one another so as to construct the laminated assembly via, for example, a lamination process using the first and second sealing members 5 and 6.

The solar cell strings each include a plurality of solar cells connected in series. The solar cell strings may be connected in parallel. The solar cell may be an entire solar cell or a one-Nth fragment cut from an entire solar cell, where 1<N≤4. The entire solar cell may be referred to as a mother solar cell. That is, the solar cell may be an entire solar cell, a one-half fragment, a one-third fragment, a quarter fragment, or the like. A type of the solar cell may be selected according to an actual requirement, which is not limited herein. The front substrate 4, the first sealing member 5, the plurality of solar cell strings, the second sealing member 6, and the back substrate 7 undergo a lamination process to obtain the laminated assembly. In this case, the laminated assembly is then assembled with the frame to form a photovoltaic module.

Further, the solar cell used in the present disclosure may be a single-sided light conversion solar cell or a double-sided light conversion solar cell. The single-sided light conversion solar cell refers to a solar cell that can receive light only from a front surface and convert the light into electrical power. The double-sided light conversion solar cell refers to a solar cell that can receive light from two surfaces and convert the light into electrical power. That is, the solar cell can not only receive direct sunlight from the front surface to convert the sunlight into electrical power, but also receive, via the back surface, light such as light reflected scattered by the ground, thereby improving power generation efficiency of the photovoltaic module. Solar cells having other light conversion regions may alternatively be selected, and a light conversion type of the solar cell may be selected according to an actual requirement, which is not limited herein.

Furthermore, positive and negative metal electrodes (including positive and negative busbars and positive and negative fingers) and PN junctions on the solar cell are located on a back surface of the solar cell. That is, the solar cell in the present disclosure is a back-contact solar cell. The positive and negative busbars of the back-contact solar cell include a plurality of first busbars and a plurality of second busbars. The plurality of first busbars and the plurality of second busbars extend along a first direction, and are distributed alternately along a second direction.

It is to be noted that, in the present disclosure, the first direction refers to a length direction of the solar cell string, that is, a series connection direction of the solar cells in the solar cell string, and the second direction refers to a width direction of the solar cell, that is, a parallel connection direction of a plurality of solar cell strings. At the same time, it is to be further noted that, along the second direction, whether the first busbar or the second busbar is the first/starting one may be selected according to an actual requirement and is not limited herein.

The back surface of the solar cell further includes first fingers and second fingers extending along the second direction. That is, the first busbar, the second busbar, the first finger, and the second finger are all located on the back surface of the solar cell. The first finger is connected to a first region of the substrate, the second finger is connected to a second region of the substrate, and the first region and the second region are doped with different polarities. For example, the first finger is connected to one of an N-doped region and a P-doped region, and the second finger is connected to the other one of the N-doped region and the P-doped region. In some embodiments, the first fingers and the second fingers are alternately arranged along the first direction. The first finger is connected to the first busbar, the second finger is connected to the second busbar, the first finger and the first busbar have same polarity, and the second finger and the second busbar have same polarity. It may be understood that the first busbar may be selected as a positive busbar and the second busbar may be selected as a negative busbar, or the second busbar may be selected as a positive busbar and the first busbar may be selected as a negative busbar, which may be selected according to an actual requirement and is not limited herein. In this case, through cooperation between the first finger and the first busbar and cooperation between the second finger and the second busbar, a light-converted current may be collected to the first busbar and the second busbar through the first finger and the second finger.

The back-contact solar cell in which positive and negative metal electrodes (including positive and negative busbars and positive and negative fingers) and PN junctions are located on a back surface of the solar cell can reduce optical losses and have a higher short-circuit current Jsc because a front surface (light conversion surface) of the solar cell is not blocked by structures such as positive and negative metal electrodes. At the same time, on the back surface of the solar cell, wider positive and negative metal electrodes may reduce series resistance Rs of the solar cell, thereby increasing an FF. Moreover, in combination with an open-circuit voltage gain caused by a front surface field of the solar cell and good passivation, output power of the back-contact solar cell is increased, and conversion efficiency of the back-contact solar cell is high. Therefore, the back-contact solar cell has good commercial prospects.

In some embodiments, the solar cells in the present disclosure are connected to form a solar cell string through conductive wires 3 and pads, and a high-efficiency output module can be obtained. A conventional pad arrangement manner is generally as follows. After the first busbars and the second busbars extending along the first direction are alternately arranged on the back surface of the solar cell, positions of the pads are determined respectively on the first busbars and the second busbars. That is, pads of the back-contact solar cell are also all arranged on the back surface of the solar cell. A plurality of pads on the first busbar are equally spaced, and a plurality of pads on the second busbar are equally spaced, and a distance between adjacent pads on the solar cell along the first direction is equal to a distance between an outermost pad of the solar cell and an edge of the solar cell adjacent to the outermost pad. The distance b is 7 mm to 18 mm. In some embodiments, the distance b may be, for example, 7 mm, 9 mm, 11 mm, 13 mm, 15 mm, 17 mm, 18 mm, or the like, or may be other values in the range, which may be selected according to an actual requirement and is not limited herein. When adjacent solar cells are connected through a conductive wire, a distance between adjacent pads at edges of adjacent solar cells along the first direction is $c \geq 2b$, c is within a range of 16 mm to 33 mm. In some embodiments, the distance c may be, for example, 16 mm, 18 mm, 21 mm, 24 mm, 27 mm, 29 mm, 31 mm, 33 mm, or the like, or may be other values in the range, which may be selected according to an actual requirement and is not limited herein. It may be understood that the arrangement that the pads on the first busbar and the pads on the second busbar are equally spaced and the distance is $c \geq 2b$ and c is within a range of 16 mm to 33 mm may lead to a longer length of the conductive wire 3 to connect adjacent pads of adjacent solar cells, and the conductive wire 3 that is excessively long is prone to deviation or distortion during the soldering and lamination.

Figure 2:
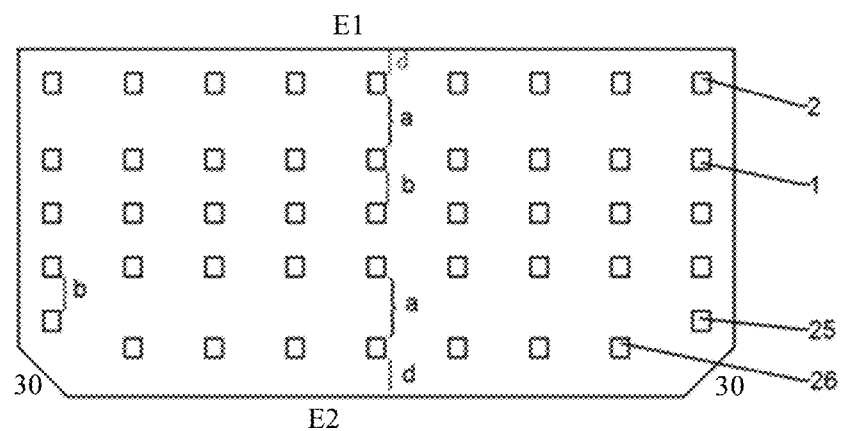
FIG. 2 is a schematic structural diagram of a solar cell according to the present disclosure.

In view of this, the present disclosure provides a solar cell. Referring to FIG. 2 to FIG. 8, a plurality of first pad groups 1 and at least one second pad group 2 are arranged along a first direction on a back surface of the solar cell. Each first pad group 1 may be a row of pads, and each second pad group 2 may be a row of pads. As shown in FIG. 2, the solar cell may have a cut edge E1 and a non-cut edge E2 opposite to the cut edge. The solar cell may have chamfered corners 30 between which the non-cut edge E2 exists. The second pad group 2 is distributed in a region of the solar cell close to the cut edge or the non-cut edge of the solar cell. The first pad groups 1 are distributed in a region of the solar cell away from the cut edge or the non-cut edge. Along the first direction, for one or more pads in the second pad group 2, a distance a between each of the one or more pads in the second pad group 2 and a pad in the first pad group 1 adjacent to the pad in the second pad group 2 are greater than a distance b between adjacent pads, along the first direction, in adjacent first pad groups 1.

In the above solution, according to the solar cell provided in the present disclosure, at least one pad in the second pad group 2 in the region of the solar cell close to the cut edge or the non-cut edge are moved outwards, which can shorten the distance between adjacent pads on adjacent solar cells. When adjacent pads on adjacent solar cells are connected through the conductive wire 3, deviation and distortion of the conductive wire 3 during soldering and lamination can be prevented, and the photovoltaic module has a high yield.

In one example, the conductive wire 3 may include a core layer and a solder layer. The core layer is formed of a metal, and the solder layer is coated over the surface of the core layer at a small thickness. The solder layer includes a solder material so as to enable soldering with the pad. In one example, the core layer may include at least one of Ni, Cu, Ag, or Al. The solder layer may be formed of an alloy including at least one of Sn, Pb, Ag, Bi, or In.

It may be understood that, compared with the conventional arrangement that the pads on the first busbar and the pads on the second busbar are at equal distances, in the present disclosure, at least one pad is moved outwards to be closer to the cut edge or the non-cut edge. When adjacent solar cells are connected by the conductive wire, if the solar cells are connected at adjacent cut edges, the distance between adjacent pads at the adjacent cut edges along the first direction is less than 2b, and if the solar cells are connected at the non-cut edges, the distance between adjacent pads of adjacent solar cells is also less than 2b, that is, the length of the conductive wire 3 for connecting adjacent pads of adjacent solar cells is reduced, thereby reducing the problem of deviation or distortion of the conductive wire 3 during the soldering and lamination.

In some embodiments, along the first direction, the distance a between at least one pad in the second pad groups 2 and its adjacent pad in the first pad groups 1 and the distance b between adjacent pads in adjacent first pad groups 1 satisfy: a−b=(2 mm to 6 mm). That is, a value of the distance a may range from 9 mm to 24 mm. In some embodiments, the value of the distance a may be, for example, 9 mm, 11 mm, 13 mm, 15 mm, 17 mm, 19 mm, 21 mm, 24 mm, or the like, or may be other values within the range, which may be selected according to an actual requirement and is not limited herein. The value of the distance a is 12 mm to 21 mm in some embodiments, and is 15 mm to 18 mm in some embodiments.

In some embodiments, a value of "a−b" may be 2 mm, 3 mm, 4 mm, 5 mm, 6 mm, or the like, or may be other values in the range, which may be selected according to an actual requirement and is not limited herein. If the value of "a−b" is small, the distance for the pads to move outwards along the first direction is insufficient, and a spacing between adjacent pads of adjacent solar cells is still large, soldering or lamination requirements of the conductive wire 3 cannot be met. If the value of "a−b" is large, the distance for the pads to move outwards along the first direction is large, the spacing between adjacent pads in the solar cell is large, and the length of the conductive wire 3 connecting the adjacent pads in the adjacent solar cells is required to be increased, deviation or distortion also easily occurs during the soldering and lamination. In some embodiments, the value of "a−b" is 3 mm to 5 mm. In some embodiments, the value of "a−b" is 4 mm to 4.5 mm.

In some embodiments, along the first direction, a distance d between a pad in the second pad group 2 and the cut edge or the non-cut edge of the solar cell is 5 mm to 12 mm. That is, a distance d between an outermost pad of the solar cell and an edge of the solar cell adjacent to the outermost pad is 5 mm to 12 mm. In some embodiments, the distance d may be, for example, 5 mm, 6 mm, 7 mm, 8 mm, 9 mm, 10 mm, 11 mm, 12 mm, or the like, or may be other values within the range, which may be selected according to an actual requirement and is not limited herein. If the distance between the outermost pad of the solar cell and the adjacent edge of the solar cell is large, that is, the distance for the pads to move outwards along the first direction is insufficient, and a spacing between adjacent pads of adjacent solar cells is still large, soldering or lamination requirements of the conductive wire 3 cannot be met. If the distance between the outermost pad of the solar cell and the adjacent edge of the solar cell is small, the distance for the pads to move outwards along the first direction is large, that is, the spacing between adjacent pads in adjacent solar cell is large, and the length of the conductive wire 3 connecting the adjacent pads in adjacent solar cells is required to be increased, deviation or distortion also easily occurs during the soldering and lamination.

In some embodiments, the second pad group 2 at the above distance from the edge of the solar cell is distributed in a region of the solar cell close to the cut edge or non-cut edge, and the first pad groups 1 are distributed in a region of the solar cell away from the cut edge or non-cut edge. That is, the first pad groups 1 are arranged in a middle region of the solar cell, and the second pad group 2 is arranged in an edge region of the solar cell. A plurality of first pad groups 1 are arranged in the middle region, and the distance b between pads, adjacent along the first direction, in adjacent first pad groups 1 is equal. A number of the second pad groups 2 arranged in the edge region may be selected according to the non-cut edge or the cut edge.

It is to be noted that, when the solar cell used in the present disclosure is an entire solar cell, the solar cell includes two non-cut edges and has no cut edge. When the solar cell is a one-Nth fragment, the solar cell includes at least one cut edge, for example, includes a cut edge and a non-cut edge, or includes two cut edges. The type of the solar cell is not limited in the present disclosure, which may be selected according to an actual requirement.

In some embodiments, the second pad group 2 is arranged at the cut edge.

In one or more embodiments, still referring to FIG. 2, one second pad group 2 is distributed in the region of the solar cell close to the cut edge. A distance a between a pad in the second pad group 2 and a pad in the first pad group 1 adjacent to the pad in the second pad group 2 is greater than the distance b between pads, adjacent along the first direction, in adjacent first pad groups 1. That is, pads of the second pad group 2 in the region at the cut edge are all moved outwards.

Figure 3:
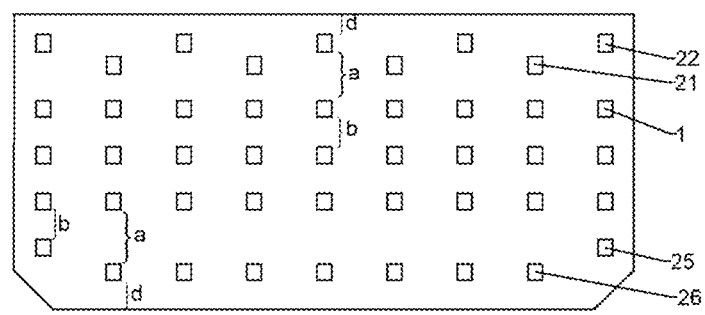
FIG. 3 is a schematic structural diagram of another solar cell according to the present disclosure.

In another embodiment, still referring to FIG. 3, two second pad groups 2 are distributed in the region of the solar cell close to the cut edge, the two second pad groups 2 are a third pad group 21 and a fourth pad group 22 respectively, and the fourth pad group 22 is closer to the cut edge than the third pad group 21. A distance between a pad in the third pad group 21 and a pad in the first pad groups 1 adjacent to the pad in the third pad group 21 along the first direction is equal to the distance between pads, adjacent along the first direction, in adjacent first pad groups 1, and a distance a between a pad in the fourth pad group 22 and a pad in the first pad groups 1 adjacent to the pad in the fourth pad group 22 along the first direction is greater than the distance b between pads, adjacent along the first direction, in the adjacent first pad groups 1. That is, part of the pads of the second pad groups 2 in the region at the cut edge are moved outwards. It is to be noted that the pads moved outwards may be pads on the first busbar or pads on the second busbar, which may be selected according to an actual requirement and is not limited herein.

In some embodiments, when the second pad group 2 is arranged at the non-cut edge, due to a special structure of the chamfered corner, the non-cut edge includes two second pad groups 2, the two second pad groups 2 are a fifth pad group 25 and a sixth pad group 26 respectively, and the sixth pad group 26 is closer to the non-cut edge than the fifth pad group 25.

In the present disclosure, a chamfering angle of the chamfered corner is 40° to 45°. In some embodiments, the chamfering angle may be, for example, 40°, 41°, 42°, 43°, 44°, 45°, or the like, or may be other values in the range, which may be selected according to an actual requirement and is not limited herein. It may be understood that, when the chamfering angle is within the above range, stress at corners may be within a minimum range. In some embodiments, the chamfering angle of the chamfered corner is 41° to 44°. In some embodiments, the chamfering angle of the chamfered corner is 42° to 43°.

In one or more embodiments, still referring to FIG. 2 or FIG. 3, the solar cell includes two chamfered regions, and the fifth pad group 25 is only arranged in the chamfered region. That is, except the pads in the chamfered region, all the other pads of the second pad groups 2 are moved outwards to form the sixth pad group 26.

Figure 4:
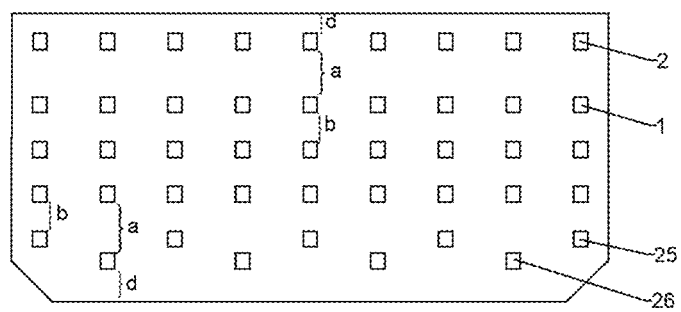
FIG. 4 is a schematic structural diagram of yet another solar cell according to the present disclosure.
Figure 5:
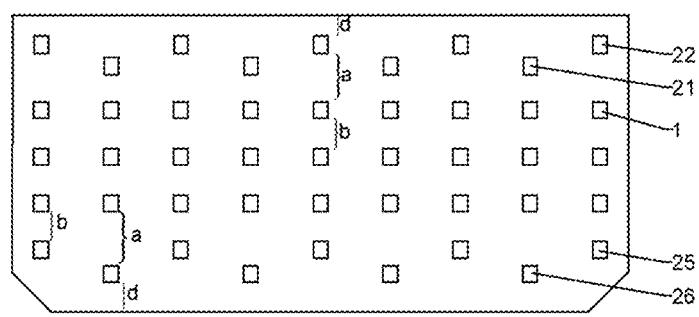
FIG. 5 is a schematic structural diagram of still another solar cell according to the present disclosure.

In another embodiment, still referring to FIG. 4 or FIG. 5, part of the pads of the second pad group 2 are displaced to form the sixth pad groups 26. All the pads moved outwards are pads on the first busbars or pads on the second busbars, which may be selected according to an actual requirement and is not limited herein.

In the above embodiments, a distance between a pad in the fifth pad group 25 and a pad in the first pad groups 1 adjacent to the a pad in the fifth pad group 25 along the first direction is equal to the distance b between pads, adjacent along the first direction, in adjacent first pad groups 1, and a distance a between a pad in the sixth pad group 26 and a pad in the first pad groups 1 adjacent to the pad in the sixth pad group 26 along the first direction is greater than the distance b between pads, adjacent along the first direction, in adjacent first pad groups 1.

It is to be noted that a sum of a number of pads of the third pad group 21 and a number of pads of the fourth pad group 22 is equal to a number of pads of one first pad group 1, and a sum of a number of pads of the fifth pad group 25 and a number of pads of the sixth pad group 26 is equal to a number of pads of one first pad group 1.

During implementation of a manufacturing process, firstly, a plurality of pads are arranged on busbars on a back surface of a solar cell to form a plurality of first pad groups 1 and at least one second pad group 2 arranged along a first direction. The second pad group 2 is distributed in a region of the solar cell close to a cut edge or a non-cut edge, and the first pad groups 1 are distributed in a region of the solar cell away from the cut edge or the non-cut edge. Along the first direction, a distance a between a pad in the second pad group 2 and a pad in the first pad groups 1 adjacent to the pad in the second pad group 2 is greater than a distance b between adjacent pads in adjacent first pad groups 1. The solar cell in which a distance between pads meets a requirement can be obtained.

It is to be noted that, when adjacent solar cells are connected by stitch soldering, a distance between pads in adjacent second pad groups 2 at ends of the adjacent solar cells is e<2d. When the adjacent solar cells are connected by non-stitch soldering, the distance between pads in the adjacent second pad groups 2 at ends of the adjacent solar cells is e≥2d. A manner in which the adjacent solar cells are connected may be selected according to an actual requirement, and is not limited herein.

Figure 6:
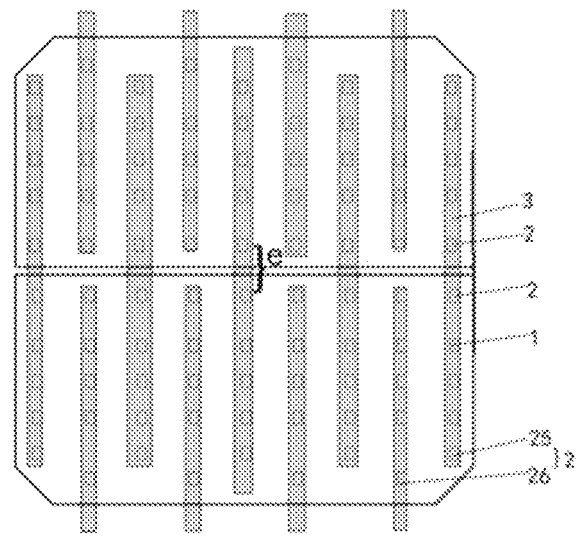
FIG. 6 is a schematic structural diagram of adjacent solar cells according to the present disclosure.
Figure 7:
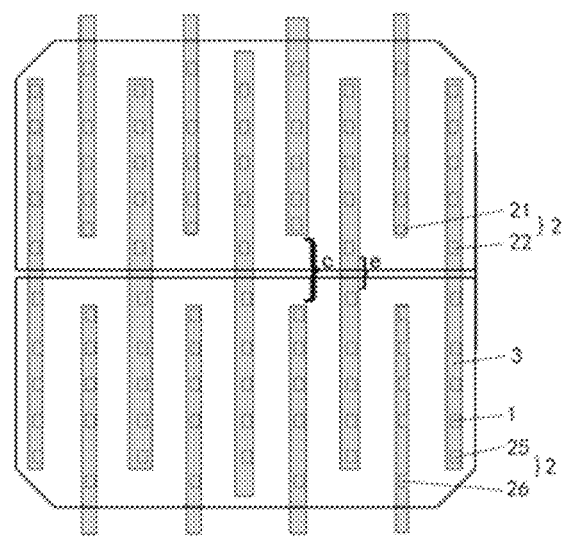
FIG. 7 is a schematic structural diagram of adjacent solar cells according to the present disclosure.
Figure 8:
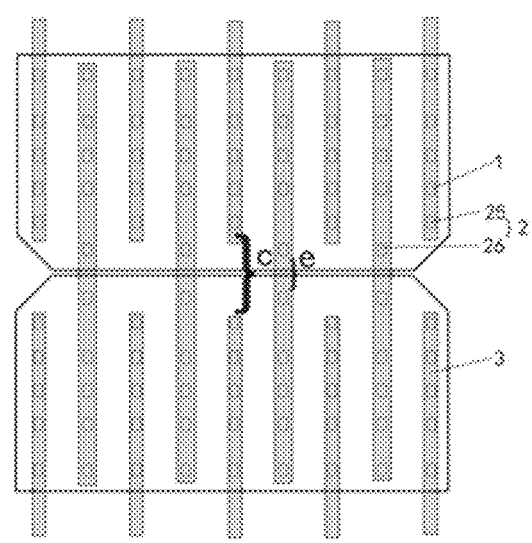
FIG. 8 is a schematic structural diagram of adjacent solar cells according to the present disclosure.

FIG. 6, FIG. 7, and FIG. 8 show different connection manner of conductive wires between adjacent solar cells when pads are moved outwards in different manners. The solar cells in the solar cell string include a first solar cell and a second solar cell adjacent to the first solar cell. As shown in FIG. 6 and FIG. 7, the cut edge of the first solar cell is adjacent to the cut edge of the second solar cell. As shown in FIG. 8, the non-cut edge of the first solar cell is adjacent to the non-cut edge of the second solar cell. After adjacent solar cells are connected by the conductive wire, the distance e between pads in second pad groups 2, adjacent along the first direction, at opposite edges of the adjacent solar cells is 9 mm to 25 mm. In some embodiments, the distance e between pads in second pad groups 2, adjacent along the first direction, at opposite edges of the adjacent solar cells may be, for example, 9 mm, 12 mm, 15 mm, 18 mm, 21 mm, 24 mm, 25 mm, or the like, or may be other values in the range, which may be selected according to an actual requirement and is not limited herein. If the distance between pads in the second pad groups 2 of adjacent solar cells is large, the distance for the pads to move outwards is insufficient, and a spacing between adjacent pads of adjacent solar cells is still large, soldering or lamination requirements of the conductive wire 3 cannot be met. If the distance between the pads in the second pad groups 2 of the adjacent solar cells is small, the distance for the pads to move outwards is large, the spacing between adjacent pads in the solar cell is large, and the length of the conductive wire 3 connecting adjacent pads in adjacent solar cells is required to be increased, deviation or distortion also easily occurs during the soldering and lamination. In some embodiments, the distance e may be 12 mm to 21 mm. In some embodiments, the distance e may be 16 mm to 17 mm.

In some embodiments, the solar cell strings connected by the conductive wire 3 may be laminated with other accessories. During the lamination, since the solar cell is very fragile and prone to damages when pressed, and the front substrate 4 and the back substrate 7 cannot be directly attached thereto, the first sealing member 5 and the second sealing member 6 are required to play a bonding role. In actual use, the first sealing member 5 and the second sealing member 6 are configured to encapsulate solar cells arranged at intervals. For example, the first sealing member 5, the solar cell strings, and the second sealing member 6 are laminated to obtain an assembly, and then the assembly is heated to a temperature, so that the first sealing member 5 and the second sealing member 6 are melted and bonded with the solar cells.

It is to be noted that the first sealing member 5 and the second sealing member 6 used in the present disclosure may be ethylene vinyl acetate (EVA), polyolefin elastomer (POE), or polyethylene terephthalate (PET), or polyvinyl butyral (PVB), EPE (three-layer co-extruded of EVA, POE, and EVA), or EP (two-layer co-extruded of EVA and POE), other types of sealing members, which may be selected according to an actual requirement and are not limited herein. In some embodiments, the first sealing member 5 and the second sealing member 6 used in the present disclosure are EVA. The EVA are non-adhesive at room temperature, have good flexibility, transparency, surface gloss, stable chemical properties, anti-aging, and good ozone resistance strength, are non-toxic, and undergo melt bonding and cross-linking curing after a condition of hot pressing. The cured sealing members have excellent light transmittance, bonding strength, thermal stability, air tightness, and aging resistance. When a plurality of solar cell strings are wrapped, light conversion performance of the photovoltaic module may not be affected.

The front substrate 4 is arranged on the side of the first sealing member 5 away from the solar cell. The front substrate 4 is also called "photoelectric glass", and has good light transmission and high hardness, which, after covering the first sealing member 5, can adapt to a large temperature difference between day and night and a bad weather environment, thereby protecting the solar cell. The front substrate 4 used in the present disclosure may be ultra-clear photovoltaic figured glass, ultra-clear machined float glass, or transparent conductive oxide (TCO) glass, and may also be other types of front substrates 4, which may be selected according to an actual requirement and is not limited herein.

The back substrate 7 is arranged on the side of the second sealing member 6 away from the solar cell. The back substrate 7 also protects and supports the solar cell, and has good weather resistance, water resistance, corrosion resistance, and insulation, which can not only isolate the photovoltaic module from surrounding photovoltaic environments, but also effectively protect and support the solar cell, thereby improving resistance strength of the photovoltaic module. The back substrate 7 used in the present disclosure may be glass, calendered glass, or ultra clear calendered glass.

The laminated assembly, after being bonded, may be assembled with the frame to obtain the photovoltaic module. Finally, the photovoltaic module is fixed to a bracket through a pressing block for use. The bracket is a special frame designed and mounted for supporting, fixing, and rotating the photovoltaic module, which may be a fixed bracket or a tracking bracket depending on a structure. The fixed bracket has a fixed direction and a low manufacturing cost. The tracking bracket may rotate the photovoltaic module angularly according to light intensity, which can reduce an angle between the module and direct sunlight, acquire more solar radiation, and effectively improve power generation efficiency, but has a high manufacturing cost. The bracket may be an aluminum alloy bracket, a carbon steel bracket, or a stainless steel bracket depending on a material. The structure and the material of the bracket may be selected according to an actual requirement, which are not limited herein. In actual use, a photovoltaic bracket may fix the photovoltaic module in a certain orientation, arrangement, and spacing according to topography, climate, and solar resource conditions. It may be understood that, after being fixed by the bracket, the photovoltaic module can better receive sunlight.

The present disclosure is described below with reference to specific embodiments.

Sample Setting:

Sample 1: At least part of pads of the second pad group at the edge of the solar cell are moved outwards by 2 mm to 6 mm, the distance between the outermost pad and the edge of the solar cell is 5 mm to 12 mm, and the outermost pad of the solar cell is connected to the outermost pad of an adjacent solar cell through the conductive wire, to observe a warping height of the conductive wire.

Sample 2: All pads are equally spaced, the distance between the outermost pad and the edge of the solar cell is 8 mm to 16.5 mm, adjacent outermost pads of adjacent solar cells are connected by the conductive wire, and pads are connected to pads, to observe a warping height of the conductive wire.

100 Samples 1 and 100 Samples 2 are provided. Distortion of the conductive wire is observed after the solar cells, the front substrates, the first sealing members, the second sealing members, and the back substrates of Sample 1 and Sample 2 are laminated or the like and assembled into photovoltaic modules.

Test results:

|  | Warping height <2 mm | Warping height of 2 mm to 4 mm | Warping height of 4 mm to 6 mm | Distortion ratio of conductive wire |
|---|---|---|---|---|
| Sample 1 | 0.00% | 86.36% | 13.64% | 0.00% |
| Sample 2 | 6.82% | 75.00% | 18.18% | 6.82% |

As can be seen from the above test results, according to the solar cell and the photovoltaic module provided in the present disclosure, at least part of the pads in the second pad groups 2 in the region of the solar cell close to the cut edge or the non-cut edge are moved outwards, which can shorten distances between adjacent pads on adjacent solar cells. When adjacent pads of adjacent solar cells are connected through conductive wires 3, a number of excessively high warping heights of the conductive wires in the present disclosure is lower than that in the prior art, most of which are concentrated in a range of 2 mm to 4 mm. After the lamination, the conductive wires have no distortion, and the photovoltaic module has a high manufacturing yield.

The structure, features, and effects of the present disclosure have been described in detail with reference to the embodiments shown in the accompanying drawings. The above embodiments are only preferred embodiments of the present disclosure, but the implementation scope of the present disclosure is not limited to the accompanying drawings as shown. Any changes made according to the concept of the present disclosure, or equivalent embodiments that are modified to equivalent variations, should still fall within the protection scope of the present disclosure if they do not go beyond the spirit covered by the specification and the drawings.

Unless otherwise expressly indicated herein, all numerical values indicating mechanical/thermal properties, compositional percentages, dimensions and/or tolerances, or other characteristics are to be understood as modified by the word "about" or "approximately" in describing the scope of the present disclosure. This modification is desired for various reasons including industrial practice, material, manufacturing, and assembly tolerances, and testing capability.

As used herein, the phrase at least one of A, B, and C should be construed to mean a logical (A OR B OR C), using a non-exclusive logical OR, and should not be construed to mean "at least one of A, at least one of B, and at least one of C."

The description of the disclosure is merely exemplary in nature and, thus, variations that do not depart from the substance of the disclosure are intended to be within the scope of the disclosure. Such variations are not to be regarded as a departure from the spirit and scope of the disclosure.

What is claimed is:

1. A solar cell comprising:
a plurality of first pad groups and a second pad group,
wherein the plurality of first pad groups and the second pad group are distributed along a first direction on a back surface of the solar cell, the second pad group is located in a region adjacent to a cut edge or a non-cut edge of the solar cell, and the plurality of first pad groups are distributed in a region away from the cut edge or the non-cut edge of the solar cell,
wherein a distance, along the first direction, between a pad in the second pad group and a pad in the plurality of first pad groups adjacent to the pad in the second pad group is greater than a distance, along the first direction, between adjacent pads in adjacent first pad groups of the plurality of first pad groups,
wherein the second pad group comprises two second pad groups distributed in the region of the solar cell adjacent to the cut edge, the two second pad groups are a third pad group and a fourth pad group respectively, and the fourth pad group is closer to the cut edge than the third pad group, and
wherein a distance between a pad in the third pad group and a pad in the first pad groups adjacent to the pad in the third pad group is equal to the distance between adjacent pads in adjacent first pad groups, and a distance between a pad in the fourth pad group and a pad in the first pad groups adjacent to the pad in the fourth pad group is greater than the distance between adjacent pads in adjacent first pad groups.

2. The solar cell according to claim 1, wherein, along the first direction, a difference between the distance between the pad in the second pad group and the pad in the plurality of first pad groups adjacent to the pad in the second pad group and the distance between adjacent pads in adjacent first pad groups ranges from 2 mm to 6 mm.

3. The solar cell according to claim 1, wherein, the second pad group comprises a second pad group adjacent to the cut edge and a second pad group adjacent to the non-cut edge, along the first direction, a distance between a pad in the second pad group adjacent to the cut edge and the cut edge of the solar cell ranges from 5 mm to 12 mm, and a distance between a pad in the second pad group adjacent to the non-cut edge and the non-cut of the solar cell ranges from 5 mm to 12 mm.

4. The solar cell according to claim 1, wherein a sum of a number of pads in the third pad group and a number of pads in the fourth pad group is equal to a number of pads in each first pad group.

5. The solar cell according to claim 1, wherein the second pad group further comprises two second pad groups distributed in the region of the solar cell adjacent to the non-cut edge, the two second pad groups are a fifth pad group and a sixth pad group respectively, and the sixth pad group is closer to the non-cut edge than the fifth pad group, and wherein a distance between a pad in the fifth pad group and a pad in the first pad groups adjacent to the pad in the fifth pad group is equal to the distance between adjacent pads in adjacent first pad groups, and a distance between a pad in the sixth pad group and a pad in the first pad groups adjacent to the pad in the sixth pad group is greater than the distance between adjacent pads in adjacent first pad groups.

6. The solar cell according to claim 5, wherein a sum of a number of pads in the fifth pad group and a number of pads in the sixth pad group is equal to the number of pads in each first pad group.

7. The solar cell according to claim 1, wherein pads in the third pad groups are arranged alternatively with pads in the fourth pad groups.

8. The solar cell according to claim 1, wherein the solar cell is a half fragment, a one-third fragment, or a quarter fragment cut from a mother solar cell.

* * * * *